United States Patent
Hashimoto

[11] Patent Number: 5,807,647
[45] Date of Patent: Sep. 15, 1998

[54] METHOD FOR DETERMINING PHASE VARIANCE AND SHIFTER STABILITY OF PHASE SHIFT MASKS

[75] Inventor: Koji Hashimoto, Wappingers Falls, N.Y.

[73] Assignee: Kabushiki Kaisha Toshiba, Kawasaki, Japan

[21] Appl. No.: 674,805

[22] Filed: Jul. 3, 1996

[51] Int. Cl.$^6$ ............................................. G03F 9/00
[52] U.S. Cl. ............................................. 430/5; 430/30
[58] Field of Search ................. 430/5, 30; 356/372, 356/401; 250/648

[56] References Cited

U.S. PATENT DOCUMENTS

| | | | |
|---|---|---|---|
| 4,786,166 | 11/1988 | Kroko | 356/123 |
| 5,043,236 | 8/1991 | Tissier et al. | 430/30 |
| 5,044,750 | 9/1991 | Shamble | 356/372 |
| 5,300,786 | 4/1994 | Brunner et al. | 250/548 |
| 5,408,083 | 4/1995 | Hirukawa et al. | 250/201.2 |
| 5,426,503 | 6/1995 | Kusunose | 356/353 |
| 5,432,714 | 7/1995 | Chung et al. | 364/525 |
| 5,434,026 | 7/1995 | Takatsu et al. | 430/30 |
| 5,439,767 | 8/1995 | Yamashita et al. | 430/30 |
| 5,446,540 | 8/1995 | Lin | 356/345 |
| 5,476,738 | 12/1995 | Yaun | 430/30 |

FOREIGN PATENT DOCUMENTS

| | | |
|---|---|---|
| 62-115830 | 5/1987 | Japan . |
| 62-285437 | 12/1987 | Japan . |
| 63-63038 | 3/1988 | Japan . |
| 1-278018 | 11/1989 | Japan . |
| 4-255847 | 9/1992 | Japan . |
| 6-51497 | 2/1994 | Japan . |
| 6-120115 | 4/1994 | Japan . |

*Primary Examiner*—S. Rosasco
*Attorney, Agent, or Firm*—Banner & Witcoff, Ltd.

[57] ABSTRACT

A method for easily, accurately and cost-effectively determining phase variance and shifter stability in a phase shifting material is provided. The method relies on the image shortening phenomenon to determine how much phase variance there is in the phase shifting material under examination. In particular, the present invention determines phase variance based on a comparison of the shift in best focus position between an image printed according to an opaque mask and an image printed according to a phase shifting halftone mask using predetermined patterns that are sensitive to, and display a pronounced, image shortening effect, thereby facilitating accurate determination of the respective best focus positions of the images exposed by the opaque and halftone masks. Projecting the best focus position of the image exposed by the halftone mask onto the defocus continuum of the image exposed by the opaque masks enables a measurement of shift in the halftone mask image, thereby permitting quick, easy, accurate and cost-effective determination of the phase variance caused by the halftone material.

24 Claims, 6 Drawing Sheets

DEFOCUS(-)　　　BEST FOCUS　　　(+)DEFOCUS

METHOD FOR DETERMINING PHASE VARIANCE AND SHIFTER STABILITY OF PHASE SHIFT MASKS

FIELD OF THE INVENTION

The present invention relates to measurement of phase variance, i.e., phase error, of light passing through a phase-shifting material. In particular, the present invention provides an efficient, cost-effective method for determining phase variance in phase-shifting materials, whereby phase variance of phase shift masks, caused by phase deviation in the material thereof, can be quickly and accurately determined based on the image-shortening effect in a printed image corresponding to the phase shift mask. In another embodiment, the stability of the phase-shifting material is also determined based on total exposure time and focus shift caused by any instability in the shifter material.

BACKGROUND OF THE INVENTION

Currently, most semiconductor integrated circuits are formed using optical photofabrication techniques, such as, for example, photolithography. Photofabrication techniques typically utilize controlled projection of light, such as, for example, ultraviolet (UV) light, through a mask and onto a layer of light-sensitive material, referred to as resist material, deposited on a semiconductor wafer. The mask generally includes a light-transmissive substrate with a layer of light-blocking or light-attenuating, i.e., halftone, material arranged to define a pattern of circuit features which are to be transferred to the light-sensitive layer deposited on the semiconductor wafer. The mask forms a pattern which is either a negative or positive image of the pattern to be transferred to the resist coated semiconductor wafer. The image of the pattern realized on the light-sensitive layer is generally referred to as the printed image.

If a negative acting resist is used, the projected exposure light passing through the mask will cause the exposed areas of the resist layer to undergo polymerization and cross-linking, thereby causing the exposed portions of the resist to have an increased molecular weight. In a subsequent development step, wherein the exposed resist coated semiconductor wafer is processed through a developer, the unexposed portions of the resist will wash off the semiconductor wafer with the developing solution, leaving a printed pattern of resist material corresponding to a reverse, or negative, image of the mask pattern. Alternatively, a positive acting resist may be used. When a positive acting resist is used, the exposure light passed through the mask will cause the exposed portions of the resist layer to become soluble to the developer, such that the exposed resist layer portions will wash away in the development step, leaving a printed pattern of resist material corresponding directly to the mask pattern. In either case, the resist material remaining on the semiconductor substrate will serve to define a pattern of exposed semiconductor material that will undergo subsequent processing steps, such as, for example, etching and deposition, for forming the desired semiconductor devices.

The formation of circuit pattern features in the sub-micron ranges, typically associated with large-scale integration (LSI) and very large-scale integration (VLSI) of components on substrates, generally requires that a corresponding degree of resolution be obtained in the exposure step. Some solutions to the resolution problem include the use of higher numerical light apertures and shorter light wavelengths, such as, for example, deep UV range light, to increase resolution. However, the solutions suffer from degraded depth of focus. The depth of focus of the projected image is critical in realizing an accurate projection of the mask through the resist material. Typically, exposure light will be required to pass through relatively substantial resist material thickness, and it is extremely important that the mask pattern be accurately projected throughout the depth of the resist material. Additionally, an increased depth of focus will tend to minimize the adverse effects of slight deviations of the exposure tool from a best focus position, i.e., defocus conditions. Even the most precise photofabrication equipment cannot guarantee that sub-micron range deviations from a best focus position will not occur.

Recently, phase-shift masking techniques have been developed which significantly increase resolution for a given depth of focus. Phase-shift masks (PSMs) are distinguished from conventional photolithographic masks by the use of selectively placed mask pattern materials that allow transmission of exposure light having a phase shift of 180° (generally referred to as $\pi$). The idea of incorporating PSMs in photolithography was first pioneered in the early 1980's. This technique held great promise for extending the limits of conventional photolithography to the production of circuit features as small as 0.25 $\mu$m, and smaller. The 180° phase difference created at the mask pattern edges sets up an interference effect that significantly enhances edge contrast of the mask projection, thereby resulting in higher resolution and greater depth of focus, as compared to conventional binary intensity masks (binary intensity masks use only an opaque material, e.g., chromium, as the masking material). Advantageously, the technique of using PSMs can be employed using conventional photolithographic stepper optics and resist techniques.

Since the advent of PSMs, numerous PSM techniques have been developed in the art. Among these are alternating, subresolution, rim and attenuated phase-shifting techniques. See, for example, C. Harper, et al. *Electronic Material & Processes Handbook,* 2d ed., § 10.4, pp. 10.33–10.39 (1994), the disclosure of which is incorporated herein by reference in its entirety. Of these techniques, attenuated phase-shifting techniques are among the most versatile, because they may be applied to any arbitrary mask pattern. In attenuated PSMs, a single, slightly transmissive, i.e., halftone, absorber providing a phase shift of 180° may be used to take the place of a conventional opaque, i.e., chromium, layer of mask pattern material. Originally, attenuating PSMs were formed of two layers: a transmittance controlling layer; and a phase controller layer. More recently, advantages have been realized through the use of single-layer materials developed to perform the dual function of controlling both light transmittance and phase-shift. One such single-layer attenuating halftone material comprises $SiN_x$, as reported in Ito, et al., "Optimization of Optical Properties for Single-layer Halftone Masks," *SPIE,* Vol. 2197, p. 99 (January 1994), the disclosure of which is incorporated herein by reference in its entirety. The composition ratio is controlled by changing the amount of flowing nitrogen during manufacturing. The composition ratio of the material determines the amount of light attenuation and the phase-shifting properties thereof.

Attenuated PSMs have proven to be one of the most useful techniques for applying actual device patterns with high resolution, see, e.g., K. Hashimoto, et al., "The Application of Deep UV Phase-Shifted Single-layer Halftone Reticles to 256 Mbit Dynamic Random Access Memory Cell Patterns," *Jpn. J. Appl. Phys.,* Vol. 33, pp. 6823–6830 (1994), incorporated herein by reference in its entirety. However, new techniques are required to provide even greater resolution, so as to allow feature sizes at and below 0.25 μm to be consistently produced with a low defect rate. Additionally, attenuated PSMs have not eliminated the problems associated with image shortening effects.

Image shortening is a phenomenon that reduces the attainable resolution of the image projected by the mask. For example, in certain feature shapes, such as, elongated holes used to provide storage node isolation and some contact hole levels in DRAM patterns, a slight defocus will result in a substantial shortening of the hole images projected onto the underlying wafer. The image shortening occurs because, particularly in a defocus condition, e.g., ±1.0 μm, image intensity and contrast tend to decrease considerably toward the ends of the elongated holes.

Another characteristic of PSMs that tends to exacerbate the image-shortening effect is that of phase error or phase variance. It is well known that the ideal phase-shift of a PSM is 180°. The contribution of variance of the phase from the ideal case is critical to resolution of the image projected onto the coated semiconductor wafer. Phase error occurs when the PSM shifts the light at a phase angle other than the optimal 180°. Small phase errors can cause very large variations in resolution capability. In order to achieve acceptable lithographic performance in attenuated PSMs, it has been found that the phase variance must be controlled to within ±3° of ideal, i.e., 180°, on halftone film. Phase error may be theoretically determined mathematically based on the measured characteristics of the halftone PSM material. For example, the refractive index of the material may be measured spectrographically. The refractive value, n, of a given halftone material may be mathematically expressed as n, where:

$$\tilde{n} = n - ik, \qquad (1)$$

wherein n is the real part component and k is the imaginary component related to transmittance of the material. The phase shift, φ, caused by the material may be determined based on the following relationship:

$$\phi = \frac{\lambda}{2(n-1)} \qquad (2)$$

where λ is the wavelength of light used. However, this method is inaccurate and unacceptable because halftone materials are typically amorphous and the distribution of the n and k components is variable. Accordingly, the phase values are not uniform over the entire area of the halftone material, i.e., the phase values vary through the halftone film. Because the mathematical model assumes that phase is uniform throughout the material, using the indirect method will not provide an accurate determination of phase variance resulting from use of the halftone material.

Accordingly, techniques have been developed to directly measure the phase error of given halftone films to determine whether they fall within acceptable parameters. Some of the tools that have been developed include measurement by interferometer, spectroscopic ellipsometer, spectrophotometer and direct aerial measurement. However, these tools suffer from high cost, and the marginal accuracy of the measurements obtained from these methods makes them of questionable value.

Therefore, what is needed is a cost-effective, efficient and accurate means for measuring phase variance in halftone PSMs.

SUMMARY OF THE INVENTION

Accordingly, the present invention provides a method for determining phase variance in a phase-shifting material that overcomes the deficiencies of known measurement techniques. In particular, the present invention determines phase variance based on a comparison of the shift in best focus position between an image exposed in accordance with an opaque mask and one exposed in accordance with a phase-shifting mask using predetermined patterns and exposures that are susceptible to a pronounced and easily measurable image shortening effect, thereby permitting accurate determination of best focus position of patterns exposed by both the opaque pattern and the phase-shifting material pattern. Best focus position is a position at which the exposed printed image has maximal length.

Therefore, it is an object of the present invention to provide a method for determining phase variance of a phase-shifting material that is less costly, more efficient and more accurate than known phase variance measurement methods and apparatuses.

It is another object of the present invention to take advantage of the image shortening effect to determine the relative best focus position of the opaque and halftone masks, and use the differences in best focus position between an image exposed by an opaque pattern, as compared to an image exposed by a phase-shifting pattern, to determine phase variance, thereby obviating the need for expensive and inaccurate prior art methods.

Yet another object of the present invention is to provide a method for determining phase variance of a phase-shifting material, wherein the phase-shifting material is used as a mask for the opaque material, thereby achieving improved contrast in the exposed image and making the measurement of best focus position for both the image associated with the opaque material and the image associated with the phase-shifting material more accurate. Where the determination of best focus position is made more accurate, the determination of phase variance is, accordingly, made more accurate.

It is another object of the present invention to use a pattern that has an especially pronounced image-shortening effect, thereby facilitating a more accurate best focus determination and an accordingly more accurate phase variance determination. It has been found that a diamond shaped pattern having extremely acute angles at the points thereof is particularly well-suited in achieving the advantages of the present invention. Additionally, it has been found that the ratio of the length of the diamond pattern to the width of the diamond pattern is optimal in the range of 10:1–20:1.

It is another object of the present invention to provide a method in which different patterning alternatives may be used. For example, the method of the present invention may be used with patterns that are formed separately on the phase-shifting material and the opaque material and patterns that are formed using the phase-shifting material as the mask for the opaque material.

It is yet another object of the present invention to provide a method for determining the stability of a phase-shifting material using exposure time and the change in phase with respect to exposure time to determine a specification for acceptable phase-shifting film stability.

These and other objects, and their attendant advantages, are achieved by the present invention, which provides an improved method for determining phase variance in a phase-shifting material comprising the steps of: forming a mask on a light-transmissive substrate, said mask comprising a first pattern of an opaque material and a second pattern of a phase-shifting material; exposing a photosensitive material by transmitting light through the mask and onto the photosensitive material; developing the exposed photosensitive material; determining the best focus position of a first image created by exposure of the photosensitive material based on the first pattern; determining a best focus position of a second image created by exposure of the photosensitive material based on the second pattern; comparing the best focus position of the first image to the best focus position of the second image to determine a shift of the best focus position of the second image from the best focus position of the first image; and determining the phase variance of the phase-shifting material based on the comparison of the shift in best focus position between the first and second images.

BRIEF DESCRIPTION OF DRAWINGS

The invention will be described in detail herein with reference to the following drawings in which like reference numerals refer to like elements, and wherein.

DETAILED DESCRIPTION OF PREFERRED EMBODIMENTS

Image shortening, as discussed above, relates to the reduction of the attainable resolution of the image projected by the mask. Image shortening is typically caused by a reduction of image intensity and contrast at the ends of elongated patterns, such as, for example, elongated holes. Image shortening is also caused by a defocus condition of the exposure. When using phase-shifting materials in the mask, phase error or phase variance, i.e., the variance in phase from the ideal case of 180°, also tends to contribute to the image shortening effect. The contribution of phase variance is critical to resolution of the projected image. A small change in phase from the ideal case can cause a very large variation in resolution capability. It has been found that in order to achieve acceptable photolithographic performance in attenuated PSMs, phase variance must be controlled to within ±3° of the ideal phase shift of 180°.

Figure 2:
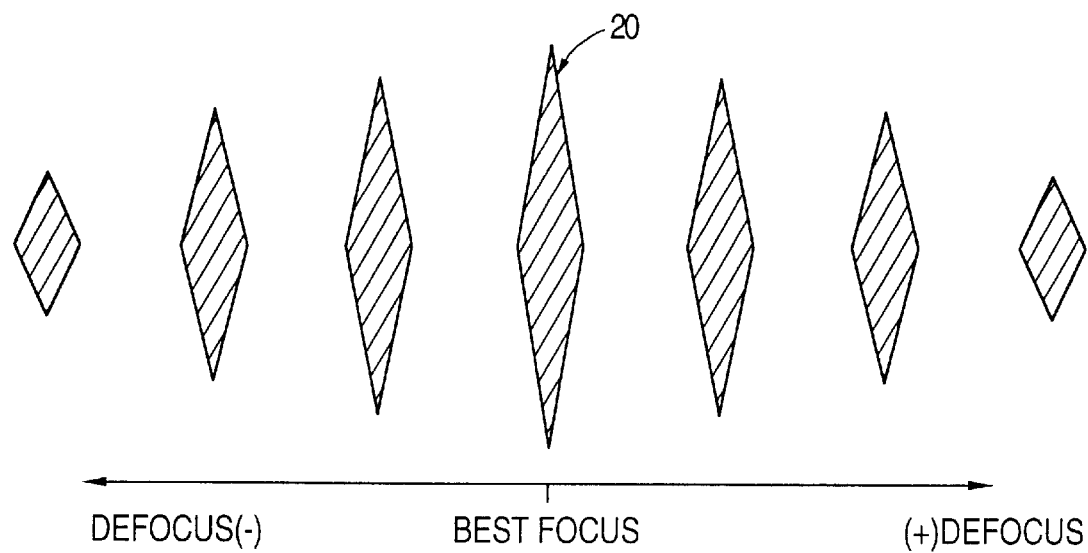
FIG. 2 is a schematic illustration of the image shortening effect of the diamond-shaped pattern, shown in FIG. 1, with respect to the best focus position.

It has also been found that there is a relationship between phase variance and the shift in the best focus position of the PSM created image with respect to the best focus position of an image projected by an opaque material. The best focus position is the position where the image projected by a particular mask is maximum, i.e., where the length of the image is maximum. Where there is a defocus condition, there is typically an image shortening effect. By comparing the best focus position of a printed image created by an opaque, i.e., chromium or chromium on glass (COG), mask, and an array of defocussed and/or shortened images, one may determine the image-shortening effect of various defocus positions within a predetermined range. Images formed using a stepper light source, such as, for example, SVGL Micrascan 2 step-and-scan system, will provide a range of exposed images in the photosensitive material corresponding to various levels of defocus. Referring to FIG. 2, there is shown an illustrative schematic drawing of a printed image according to the present invention, formed using an opaque mask. According to the illustration of FIG. 2, the best focus position image 20 is centrally located, while various levels of defocus images are shown on either side of the best focus image 20. Negative defocus is shown to the left of the best focus position and positive defocus is shown to the right of the best focus position. As illustrated in FIG. 2, defocus positions display an image-shortening effect.

In accordance with the present invention, a mask comprising opaque and attenuated PSM, i.e., halftone, materials is used to expose a photosensitive material. The best focus positions of the printed images created by each of the masks are determined by measuring the length of the exposed images. As set forth above, maximal length indicates best focus. Once the best focus position of the printed image created by exposure through the opaque mask portion is determined, the varying levels of defocus are also determined with respect to the best focus position using, for example, a light stepper. The best focus position of the printed image created by the halftone mask is then determined based on the length thereof. The best focus of the printed image corresponding to the halftone mask is subsequently compared to the defocus continuum of the image created by the opaque mask to determine where on the defocus continuum of the opaque mask the best focus position of the printed image created by the halftone mask falls with respect to the best focus position obtained using an opaque mask. If the phase variance of the halftone mask is 0°, then the best focus position of the opaque mask and the halftone mask should be the same, i.e., the maximum length for the image created by the opaque mask will be substantially the same as the maximum length of the image created by the halftone mask. On the other hand, if there is a phase variance, an image-shortening effect will be observed in the printed image corresponding to the halftone mask. The maximum length of the shortened image of the printed image created by the halftone mask is then compared to the defocus continuum of the printed image based on the opaque mask to determine where, in the defocus continuum of the printed image based on the opaque mask, the best focus position of the printed image based on the halftone mask lies. The difference on the continuum between the best focus position of the image created by the opaque mask and the best focus position of the image created by the halftone mask may be plotted and expressed as a shift from best focus position of the image created by the opaque mask as shown in FIG. 6.

Figure 3:
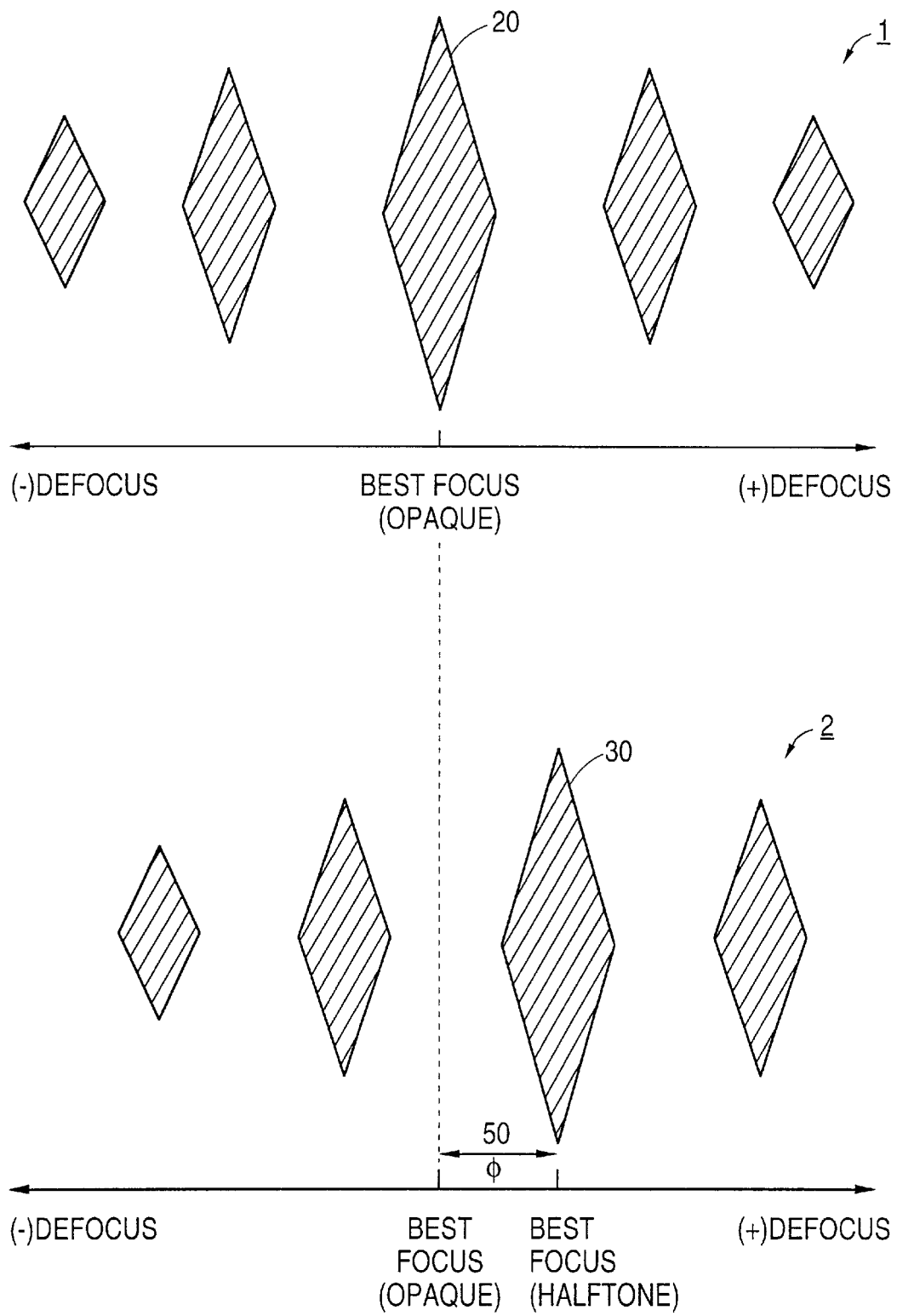
FIG. 3 shows the image-shortening effect of the diamond-shaped pattern shown in FIG. 1, for an opaque and halftone mask.

Referring briefly to FIG. 3, two printed image sets 1, 2 are shown. Image set 1 corresponds to the opaque mask printed image continuum shown in FIG. 2. Image set 2 corresponds to a printed image continuum obtained using a halftone mask. The best focus position 20 of the opaque image set 1 and the best focus position 30 of the halftone image set 2 are also indicated. The image shortening effect of both sets 1, 2 of images may be plotted on a common reference axis to determine the amount of phase shift caused by the halftone mask, as shown in FIG. 6.

Figure 6:
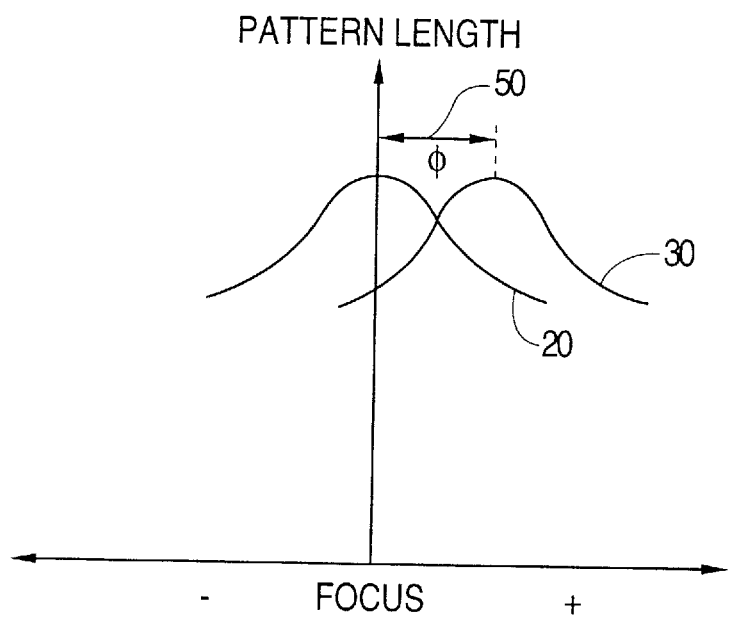
FIG. 6 is a graphical representation of the shift of best focus position between a printed pattern formed by the opaque mask and the printed pattern formed by the phase-shifting material mask.
Figure 8:
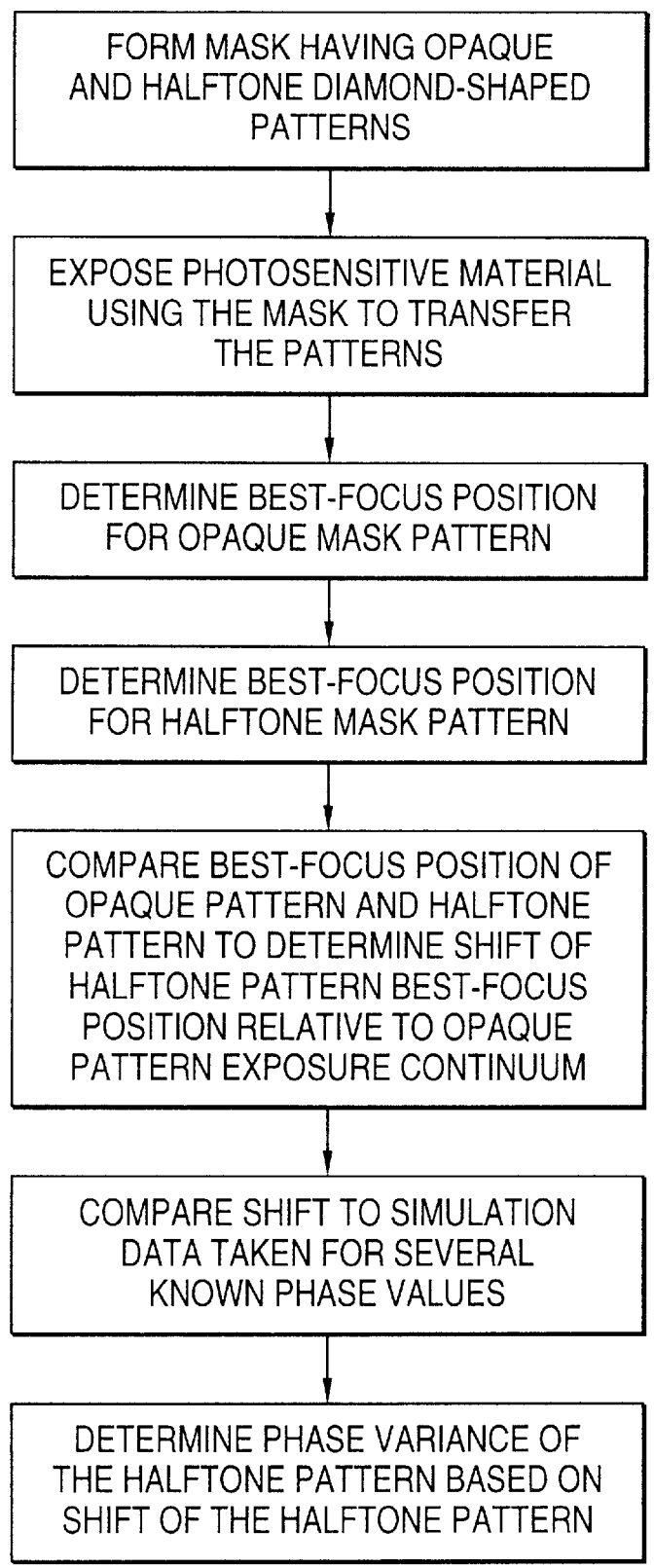
FIG. 8 is a flowchart showing how phase variance may be determined according to an embodiment of the present invention.

Referring to FIG. 6, a best focus position shift 50 of the image created by the halftone mask 30 is shown relative to the best focus position of the image created by the opaque mask 20. As set forth above, the best focus position of each of the printed images corresponds to the maximum length of the images. With reference to FIG. 6, the length of the printed images corresponds to the height of the curves 20, 30. The amount of shift 50 of the best focus position of the halftone printed image with respect to the best focus position of the opaque printed image on the opaque printed image defocus continuum is directly related to the phase variance $\phi$ of the halftone mask. The defocus continuum of the images created by the opaque and halftone masks is shown as the horizontal axis of the plot shown in FIG. 6. Therefore, it can be seen that the image-shortening effect may be used to determine phase variance $\phi$ by comparing the best focus position of an image created by an opaque mask with the best focus position of an image created by a halftone mask projected onto the defocus continuum of the opaque mask printed image. The basic steps in performing the comparison to determine phase variance of the phase-shifting material is illustrated in FIG. 8.

Figure 1:
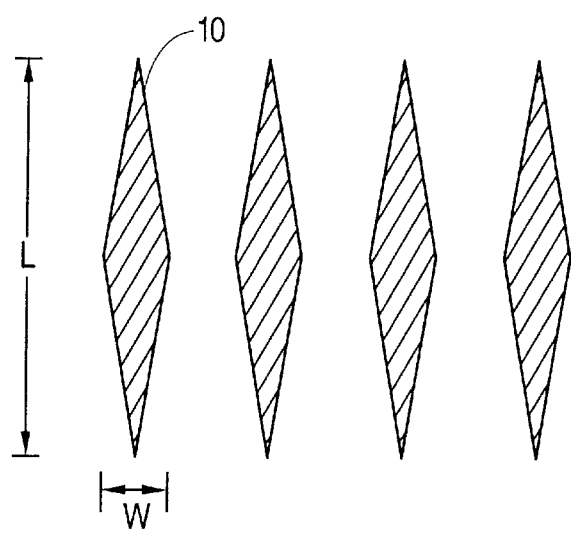
FIG. 1 is a schematic illustration of a plurality of diamond-shaped patterns that are susceptible to a pronounced image shortening effect that is easily measured, and which are used to determine phase variance in accordance with an embodiment of the present invention.

In a preferred embodiment, the shapes of the patterns used to determine phase variance according to the present invention are elongated diamonds. Diamonds 10, as shown in FIG. 1, have very acute angles at the ends thereof. Having acute, i.e., sharp, ends provides an enhanced and more pronounced image-shortening effect, thereby enabling a more accurate determination of the best focus positions of the images created via the opaque and halftone masks, respectively. The narrow tips of the diamonds are very sensitive to exposure conditions, and, therefore, to focus. Ideally, it has been found that diamonds having a length L that is in the range of ten to twenty times its width W provide sufficient acuity in the ends to enable sufficiently accurate determination of best focus position. However, it will be appreciated that any ratio that provides acceptable differentiation and accuracy of best focus determination may be used. It will also be understood that any shape that displays sufficient and accurately measurable image-shortening effects for determining phase variance may be used, and that the present invention is not limited to diamond shapes. For example, elongated wedges or other elongate rhombic patterns may also be used.

Numerous methods exist for determining the best focus position of an image printed on a wafer. One such system is the automatic laser scanning technique (LSA) developed by Nikon Precision, Inc., of Belmont, Calif., and described in detail in Suwa, et al., "Automatic Laser Scanning Focus Detection Method Using Printed Focus Pattern," *SPIE*, Vol. 2440, pp. 712–720 (1995), the disclosure of which is incorporated herein by reference in its entirety. In the LSA technique, best focus is determined via an optical step-and-repeat exposure system using an alignment sensor. The LSA scanning beam is a HeNe laser. By printing the images on a wafer at different locations in which the focus is changed, it can be determined what the best focus position is, and it is also possible to show the variations of positive and negative defocus.

Another method for determining best focus position is to perform direct measurement using a scanning electron microscope (SEM). The best focus position is determined by measuring the printed images and determining which of the printed images has the greatest length. The maximum length position is the best focus position. It is noted that all printed images are generated by a mask that is the same size for all exposures and defocus ranges tested. It will be understood that any number of methods and apparatuses for determining best focus position will be known and available to those skilled in the art. Accordingly, the description of LSA and SEM techniques are intended to be illustrative only, and not limiting. However, LSA is currently preferred due to its precision and cost relative to conventional SEM techniques. SEM techniques also require a significantly longer time to determine best focus positions of the printed images, as compared to LSA.

It will be appreciated that there may be numerous and varied methods for forming the masks used to determine phase variance in accordance with the present invention. The resulting masks may operate in a variety of conventional ways, such as, for example, attenuated PSM, alternating, i.e., Levenson, PSM, and the like. Accordingly, various PSM techniques will be apparent to those skilled in the art. Thus, the following illustrations showing different mask fabrication techniques for use in the present invention are intended to be illustrative only, and are not to be considered as limiting.

Figure 4:
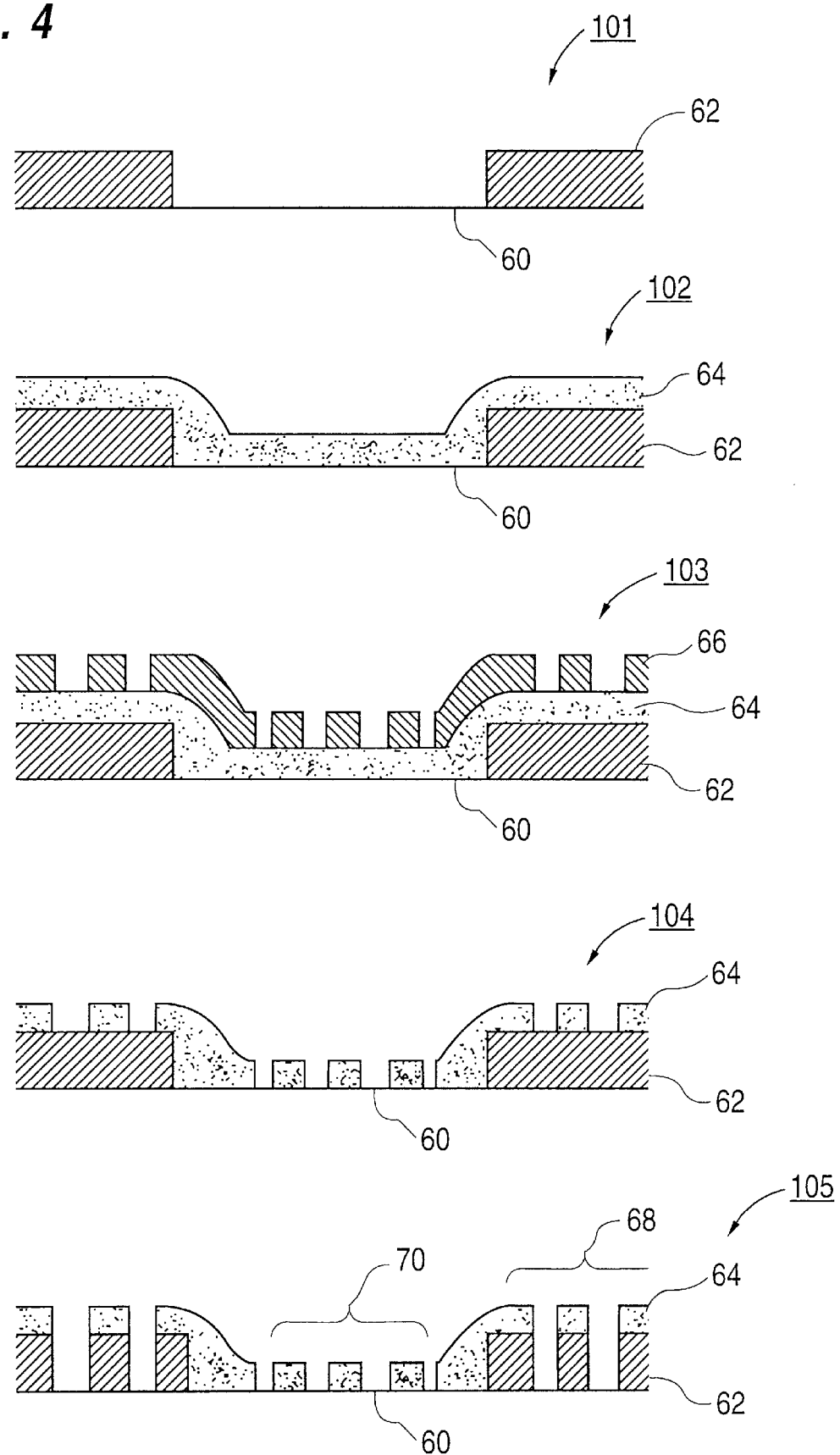
FIG. 4 shows an exemplary mask fabrication technique used to form the diamond-shaped patterns on a photosensitive substrate.

Turning now to FIG. 4, a first method for fabricating a mask for use in the present invention is shown. FIG. 4 is representative of a conventional attenuated PSM process. It will be noted that the fabrication technique is shown in cross-section for ease of understanding. In accordance with the fabrication process shown in FIG. 4, several stages of the process 101, 102, 103, 104, 105 are shown. In stage 101, an opaque material 62, such as, for example, chromium, is patterned on a light-transmissive substrate 60, such as, for example, quartz. The technique for patterning the opaque material 62 on the light-transmissive substrate 60 may include using a resist (not shown) and a wet chromium etch, reactive ion etching (RIE), etc. A halftone film 64, such as, for example, $SiN_x$, is deposited on the entire pattern, including the opaque film 62 and the exposed substrate 60 in step 102. The halftone film 64 is generally deposited by known sputtering techniques. In step 103, a resist layer 66 is patterned on the halftone film layer 64 to form the diamond patterns described above. The resist layer 66 may, for example, be deposited using conventional laser deposition of a Middle Ultraviolet (MUV) resist or Electron Beam (EB) resist. The halftone film 64 is etched in accordance with the resist pattern 66 using, for example, Reactive Ion Etching (RIE), or Chemical Dry Etching (CDE) in step 104. Step 104 also includes removal of the resist layer. Finally, using the patterned halftone film 64 as a mask, the exposed chromium film 62 is etched to form a pattern in the chromium film 62. The resulting mask comprises a halftone patterned film portion 70 and an opaque patterned film portion 68. Using this technique to form the mask is acceptable.

Figure 5:
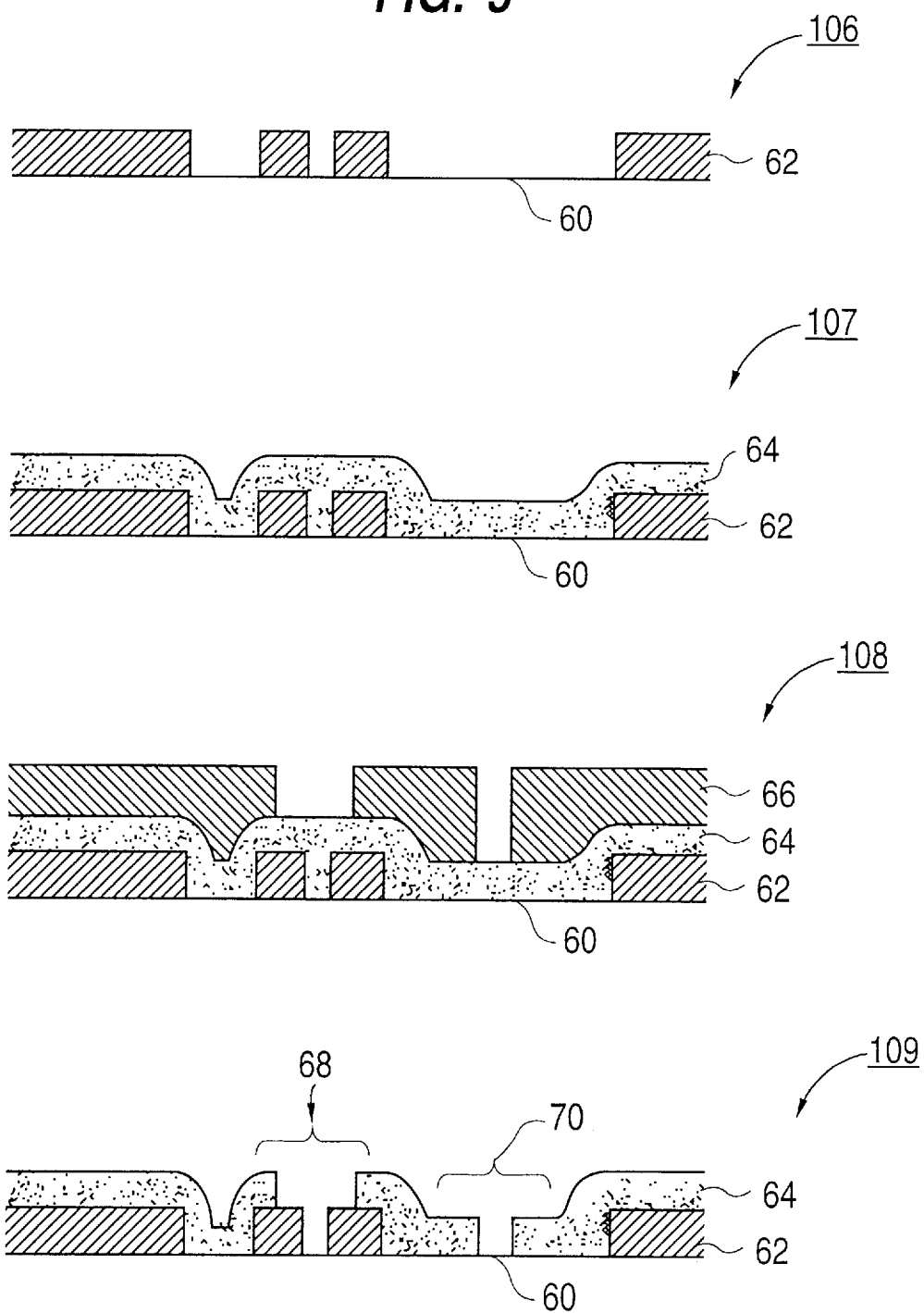
FIG. 5 shows another exemplary mask fabrication technique used to form the diamond-shaped patterns on a photosensitive substrate, wherein the phase-shifting material is used to mask the opaque material to provide improved contrast and depth of focus.

In another embodiment illustrated in FIG. 5, in stage 106, the chromium or COG is patterned in the diamond pattern using conventional pattern formation techniques. The technique for patterning the opaque material 62 on the light-transmissive substrate 60 may include, for example, using a resist (not shown) and a wet chromium etch, RIE, etc. The halftone film 64 is then deposited by, for example, sputtering, over the entire mask including the chromium 62 and the light-transmissive substrate 60, in step 107. In step 108, a resist pattern 66 for the halftone film is deposited on the halftone film 64. The resist also ensures that the previously patterned opaque material is exposed in the subsequent step. Using halftone etching, the halftone film 64 is patterned according to the pattern of the resist layer 66 to form a halftone diamond pattern 70. As set forth above, the initial deposition of chromium included the diamond pattern 68. Using the technique shown in FIG. 4 provides for a more critical chromium mask in the initial stages while using the resist for halftone etching only. Accordingly, the diamond pattern of the opaque mask is more accurate and lends itself to more precise measurement of the phase variance in accordance with the present invention.

Turning now to FIG. 6, a shift 50 between the best focus position 20 corresponding to the printed image of the opaque mask exposed area of the photosensitive material versus the best focus, i.e., maximum length, position 30 of the printed image corresponding to the halftone masked area with respect to the opaque mask defocus continuum is shown. As set forth above, by plotting the printed image continuum of the halftone mask printed image and the printed image continuum of the opaque mask printed image on a common reference axis, results in effectively projecting the halftone image continuum onto the exposure continuum of the images printed in accordance with the opaque mask. The shift 50 between the best focus position 20 of the opaque mask image and the best focus position 30 of the halftone mask image is related to the phase variance from the ideal 180° case caused by exposure through the halftone mask. Accordingly, through direct comparison, the phase variance may be determined.

Figure 7:
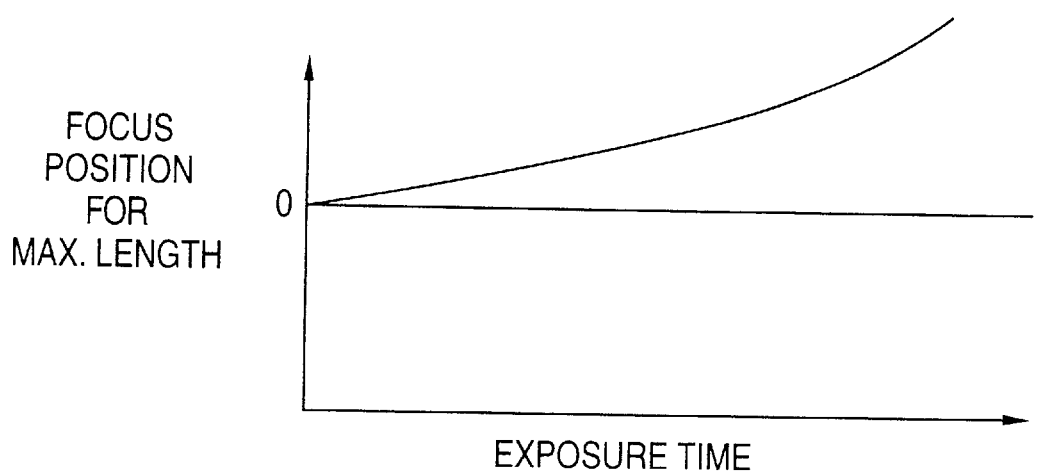
FIG. 7 is a graphical representation showing changes in phase stability of a phase-shifting material as exposure time is increased.

According to another embodiment of the present invention, the stability of the halftone film being used can be monitored. It is known that the stability of halftone films is related to the exposure time of the light used to expose the photosensitive material through the halftone mask. As the exposure time increases, the best focus position for the printed image corresponding to the halftone film mask will shift increasingly away from the best focus position of the printed image corresponding to the opaque mask. This phenomenon is illustrated in FIG. 7. For example, in the case of an SiN halftone mask, to satisfy the optimal optical parameter (n, k), the ratio: Si:N=3:0.01. However, the stable ratio of Si:N is 3:4. Thus, an excess amount of Si could combine with $O_2$ under exposure energy such that transmittance is increased, thereby causing a shift in phase. Using the present invention provides an easy way to monitor this shift.

While the invention has been described in conjunction with specific embodiments thereof, it is evident that many alternatives, modifications and variations will be apparent to those skilled in the art. Accordingly, the preferred embodiments of the invention, as set forth herein, are intended to be illustrative, not limiting. Various changes may be made without departing from the true spirit and full scope of the invention, as defined in the following claims.

What is claimed is:

1. A method for determining phase variance in a phase shifting material, comprising the steps of:

forming a mask on a light-transmissive substrate, said mask comprising a first pattern of adjacent features formed in an opaque material; and a second pattern of adjacent features formed in said phase shifting material;

exposing a photosensitive material by transmitting light through said mask and onto said photosensitive material;

developing the exposed photosensitive material;

determining an opaque material mask best focus position of a first image created by an exposure of said photosensitive material based on said first pattern;

determining a phase shifting material mask best focus position of a second image created by an exposure of said photosensitive material based on said second pattern;

comparing said opaque material mask best focus position to said phase shifting material mask best focus position to determine a shift of said phase shifting mask best focus position from said opaque material best focus position; and determining a phase variance caused by said phase shifting material based on said shift of said phase shifting material mask best focus position from said opaque material mask best focus position.

2. The method of claim 1, wherein the features of said first and second patterns have a diamond shape.

3. The method of claim 2, wherein said diamond shape has a length and a width, said length being in the range of 10 to 20 times longer than said width.

4. The method of claim 1, wherein said opaque material comprises chromium.

5. The method of claim 1, wherein said phase shifting material comprises $SiN_x$.

6. The method of claim 1, wherein said opaque material mask best focus position is a position where said first image has a maximum length, and said phase shifting material mask best focus position is a position where said second image has a maximum length.

7. The method of claim 1, wherein said step of forming said mask comprises the steps of:

depositing said opaque material on predetermined portions of said light-transmissive substrate;

depositing said phase shifting material over the substrate and the deposited opaque material;

depositing a resist material over said phase shifting material in a predetermined pattern to form a resist pattern corresponding to said first and second images;

etching said phase shifting material in accordance with said resist pattern;

removing said resist material; and etching said opaque material in accordance with a portion of said resist pattern that overlies said opaque material and corresponding to said first image.

8. The method of claim 7, wherein said opaque material comprises chromium.

9. The method of claim 7, wherein said phase shifting material comprises $SiN_x$.

10. The method of claim 7, wherein said opaque material mask best focus position is a position where said first image has a maximum length, and said phase shifting material mask best focus position is a position where said second image has a maximum length.

11. The method of claim 1, wherein the features of said first and second patterns have a diamond shape.

12. The method of claim 11, wherein said diamond shape has a length and a width, said length being in the range of 10 to 20 times longer than said width.

13. The method of claim 1, wherein said step of forming said mask comprises the steps of:

depositing said opaque material on said light-transmissive substrate in a pattern corresponding to said first pattern;

depositing said phase shifting material over said substrate and said opaque material;

depositing a resist material in a pattern corresponding to said second image over said phase shifting material, said resist material further exposing a region over said first pattern formed by said opaque material;

etching said phase shifting material; and removing said resist material.

14. The method of claim 13, wherein said opaque material comprises chromium.

15. The method of claim 13, wherein said phase shifting material comprises $SiN_x$.

16. The method of claim 13, wherein said opaque material mask best focus position is a position where said first image has a maximum length, and said phase shifting material mask best focus position is a position where said second image has a maximum length.

17. The method of claim 1, wherein the features of said first and second patterns have a diamond shape.

18. The method of claim 17, wherein said diamond shape has a length and a width, said length being in the range of 10 to 20 times longer than said width.

19. A method for measuring phase variance in a phase shifting material, comprising:

exposing a photosensitive material with a mask having a first pattern of adjacent features formed in an opaque material and a second pattern of adjacent features formed in said phase shifting material;

measuring a shift in a best focus position between an image created by said opaque material and an image created by said phase shifting material; and determining said phase variance of said phase shifting material based on said measured shift of said best focus position.

20. A mask for use in determining phase variance in a phase shifting material, comprising:

a first pattern of adjacent features formed in an opaque material;

a second pattern of adjacent features formed in said phase shifting material; and the features of said first and second patterns having a substantially identical shape, said shape being a diamond shape having acute angles at top and bottom ends thereof.

21. The mask of claim 20, wherein said diamond shape has a length and a width, said length being in the range of 10 to 20 times longer than said width.

22. The mask of claim 20, wherein said opaque material comprises chromium.

23. The mask of claim 20, wherein said phase shifting material comprises $SiN_x$.

24. The mask of claim 20, wherein said first and second patterns are arranged to expose a light sensitive material simultaneously when a light is transmitted through the mask.

* * * * *